US007739638B2

(12) United States Patent
Arayama

(10) Patent No.: US 7,739,638 B2
(45) Date of Patent: *Jun. 15, 2010

(54) CIRCUIT ANALYZING DEVICE, CIRCUIT ANALYZING METHOD, PROGRAM, AND COMPUTER READABLE INFORMATION RECORDING MEDIUM CONSIDERING INFLUENCE OF SIGNAL INPUT TO PERIPHERAL CIRCUIT WHICH DOES NOT HAVE LOGICAL INFLUENCE

(75) Inventor: Masashi Arayama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

This patent is subject to a terminal disclaimer.

(21) Appl. No.: 11/072,605

(22) Filed: Mar. 7, 2005

(65) Prior Publication Data
US 2005/0155005 A1 Jul. 14, 2005

Related U.S. Application Data

(63) Continuation of application No. PCT/JP2004/001939, filed on Feb. 19, 2004.

(30) Foreign Application Priority Data
Mar. 6, 2003 (WO) ................ PCT/JP03/02654

(51) Int. Cl.
G06F 17/50 (2006.01)
G06F 9/44 (2006.01)
(52) U.S. Cl. ............... 716/6; 716/1; 716/4; 716/5; 716/8; 716/10; 716/16; 716/17; 703/13; 703/15; 703/19; 703/20

(58) Field of Classification Search ............... 716/1, 716/3, 5, 6, 8, 10, 16; 703/19, 20; 324/677
See application file for complete search history.

(56) References Cited

U.S. PATENT DOCUMENTS

| 4,484,266 | A | * | 11/1984 | Becker et al. ............... 703/20 |
| 5,583,787 | A | * | 12/1996 | Underwood et al. ............ 716/6 |
| 5,764,528 | A | * | 6/1998 | Nakamura ................... 716/6 |
| 6,066,177 | A | * | 5/2000 | Hatsuda .................... 703/19 |
| 6,434,728 | B1 | * | 8/2002 | Arayama et al. ............. 716/6 |
| 6,453,443 | B1 | * | 9/2002 | Chen et al. ................. 716/1 |
| 6,467,071 | B2 | * | 10/2002 | Tanak ..................... 716/10 |
| 6,496,964 | B2 | * | 12/2002 | Inui et al. .................. 716/8 |
| 6,505,341 | B1 | * | 1/2003 | Harris et al. ............... 717/100 |
| 6,604,066 | B1 | * | 8/2003 | Hatsuda .................... 703/19 |
| 6,604,231 | B2 | * | 8/2003 | Kaneko .................... 716/16 |
| 6,615,392 | B1 | * | 9/2003 | Nadeu-Dostie et al. ........ 716/5 |

(Continued)

FOREIGN PATENT DOCUMENTS

JP          8-63499         3/1996

(Continued)

Primary Examiner—Helen Rossoshek
(74) Attorney, Agent, or Firm—Staas & Halsey LLP

(57) ABSTRACT

A circuit analyzing device includes: a peripheral input signal setting part configured to make a signal setting by a predetermined requirement for a peripheral input which does not logically affect operation of the predetermined circuit part, upon analyzing a signal delay in operation of a predetermined circuit part, and wherein: analysis is made for a signal propagation operation delay in operation of the predetermined circuit part, in consideration of influence of the signal input from the signal setting.

7 Claims, 10 Drawing Sheets

U.S. PATENT DOCUMENTS

| | | | |
|---|---|---|---|
| 6,643,832 B1 * | 11/2003 | Ray et al. | 716/6 |
| 6,721,933 B2 * | 4/2004 | Iwasa | 716/10 |
| 6,738,853 B1 * | 5/2004 | Higashida et al. | 710/305 |
| 6,760,889 B2 * | 7/2004 | Kawamoto | 716/3 |
| 6,795,951 B2 * | 9/2004 | Hathaway et al. | 716/5 |
| 6,940,293 B2 * | 9/2005 | Ramarao et al. | 324/677 |
| 6,971,099 B1 * | 11/2005 | Campbell et al. | 718/102 |
| 6,975,978 B1 * | 12/2005 | Ishida et al. | 703/15 |
| 7,013,438 B1 * | 3/2006 | Saldanha et al. | 716/2 |
| 7,086,022 B2 * | 8/2006 | Kurimoto | 716/6 |
| 7,127,692 B2 * | 10/2006 | Hamlin | 716/6 |
| 7,155,691 B2 * | 12/2006 | Ratzlaff | 716/6 |
| 7,225,418 B2 * | 5/2007 | Shimazaki et al. | 716/6 |
| 7,228,515 B2 * | 6/2007 | Querbach et al. | 716/6 |
| 7,254,764 B2 * | 8/2007 | Ishida et al. | 714/738 |
| 7,386,826 B1 * | 6/2008 | Keller et al. | 716/16 |
| 2004/0172605 A1 * | 9/2004 | Kuge et al. | 716/1 |
| 2005/0010886 A1 * | 1/2005 | Urata et al. | 716/6 |

FOREIGN PATENT DOCUMENTS

| | | |
|---|---|---|
| JP | 9-114870 | 5/1997 |
| JP | 9-325981 | 12/1997 |
| JP | 2000-82089 | 3/2000 |
| JP | 2000-331044 | 11/2000 |
| JP | 2001-76020 | 3/2001 |

* cited by examiner

IN1 = !IN3

(IN1,IN3) : (1,0), (0,1)

US 7,739,638 B2

CIRCUIT ANALYZING DEVICE, CIRCUIT ANALYZING METHOD, PROGRAM, AND COMPUTER READABLE INFORMATION RECORDING MEDIUM CONSIDERING INFLUENCE OF SIGNAL INPUT TO PERIPHERAL CIRCUIT WHICH DOES NOT HAVE LOGICAL INFLUENCE

CROSS-REFERENCE TO RELATED APPLICATION

This application is a U.S. continuation application filed under 35 USC 111(a) claiming benefit under 35 USC 120 and 365(c) of PCT application JP04/001939, filed on Feb. 19, 2004, which claims priority to PCT application JP03/002654, filed on Mar. 6, 2003. The foregoing applications are hereby incorporated herein by reference.

BACKGROUND OF THE INVENTION

1. Field of the Invention

The present invention relates to a circuit analyzing device, a circuit analyzing method, a program for causing a computer to execute operation of the device or the method, and a computer readable information recording medium storing the program. In particular, the present invention relates to a circuit analyzing device in which an efficiency method for testing a circuit operation delay in LSI circuit deign work, a circuit analyzing method, a program for causing a computer to execute operation of the device or the method, and a computer readable information recording medium storing the program.

2. The Related Art

Recently, in a large-scaled integrated circuit such as an LSI circuit which is indispensable for data analysis operation, various control operation or such in various industrial fields, a strict demand exists not only for high-grade circuit integration but also circuit operation timing. For this purpose, a signal delay time testing scheme (simulation) providing performance by which such circuit characteristics can be tested with a high accuracy is required.

In such an analysis for a signal delay time of a transistor circuit such as an LSI circuit, a time required by a circuit part (referred to as a 'critical path', hereinafter) which directly relates to a predetermined input/output item, from a timing of an application of a predetermined input value in an input terminal through a timing of an appearance of a predetermined output value from an output terminal is obtained. Upon carrying out such a circuit operation analysis, 'carrying out predetermined operation of the relevant circuit part' is referred to as 'activation' or 'activating' of the 'active path'. Normally, in a large-scaled integrated circuit, various active paths exist in a single circuit, and, a problem may occur as to how to set states of peripheral circuit parts upon analyzing the relevant circuit part when a specific active path is activated.

In such a circuit analysis, a signal setting for an input which does not logically affect the activation of the active path is not required in the logic circuit operation analysis. In fact, in an LSI circuit in the related art, since a demand for an increase of operation speed has not been so strict, it has been possible to obtain an effective signal delay time value, i.e., a delay value, even without especially considering operation states of the peripheral circuit parts. However, in a very high speed LSI circuit with a clock frequency of 1 GHz or more, a difference between an actual signal propagation operation delay amount, i.e., a delay time occurring in an actual circuit and a delay value obtained from a simulation increases due to a difference in a signal setting of the peripheral circuit parts. As a result, it may become difficult to carry out signal propagation operation delay time analysis, i.e., delay analysis precisely in accordance with the actual circuit. Therefore, it is necessary to even consider operation states of the peripheral circuit parts when delay analysis of an active path is carried out with a high accuracy for a very high speed LSI circuit designing work.

That is, in a circuit deign analysis in the related art, a circuit part along an active path, for which signal propagation operation delay time calculation, i.e., delay calculation is directly carried out, is extracted, for example. The delay analysis is carried out only for the thus-extracted circuit part of the active path. In this way, a signal setting for the other peripheral circuit parts which may affect activation of the relevant active path is not especially considered. However, as mentioned above, in an actual circuit of a recent very high speed LSI circuit, a delay of the active path may be much affected by signal setting states of the peripheral circuit parts. Therefore, in the above-mentioned way of extracting the circuit path along the delay calculation target path, it may not be necessarily possible to obtain an accurate load which should be applied in response to the signal transition. Further, when the signal transition or states of the peripheral circuit parts have not been sufficiently considered, a load applied to the path is fixed, and thus, a deviation of a calculation result from the actual circuit tends to increase. Other than the above-mentioned way, there is a way of generating an activation pattern especially by focusing on the active path. In this method, an accurate delay calculation is available in comparison to the above-mentioned way of extracting the relevant circuit part. However, the accuracy may not be sufficiently high also in this way.

Japanese Laid-open Patent Applications Nos. 8-63499, 9-325981 and 2001-76020 disclose the related arts.

SUMMARY OF THE INVENTION

The present invention has been devised in consideration of the above-mentioned problem, and an object of the present invention is to provide a circuit analyzing device in which, upon carrying out a signal propagation operation delay analysis for an active path, input items necessary for the signal propagation operation delay analysis for the relevant active path are extracted from among input items, which do not even directly affect activation of the active path, a suitable signal setting is made for the thus-extracted input items, and thereby, it is possible to effectively increase the accuracy of the delay analysis.

According to the present invention, upon analysis for a signal propagation operation delay for a specific operation of a specific circuit part of a predetermined circuit configuration, even input items which do not directly logically affect the predetermined operation of the specific circuit part are considered. Then, signal settings are made for these input items under a predetermined condition, and, with consideration of the influence thereof, the signal propagation operation delay in the predetermined operation is analyzed.

Thus, according to the present invention, even the input items which do not directly logically affect the predetermined operation of the specific circuit part are considered, and then, signal settings are made also thereon under the predetermined condition. As a result, it is possible to achieve signal propagation operation delay analysis of the relevant circuit part also with considering the influence of the input setting states of peripheral circuit parts under the specific condition. Thereby, it is possible to obtain an analysis result with a high accuracy for the signal propagation operation delay according to the actual operation state of the actual circuit condition of the relevant circuit configuration.

BRIEF DESCRIPTION OF THE DRAWINGS

Other objects and further features of the present invention will become more apparent from the following detailed description when read in conjunction with the accompanying drawings.

DETAILED DESCRIPTION OF THE PREFERRED EMBODIMENT

With reference to figures, an embodiment of the present invention is described below.

Figure 1:
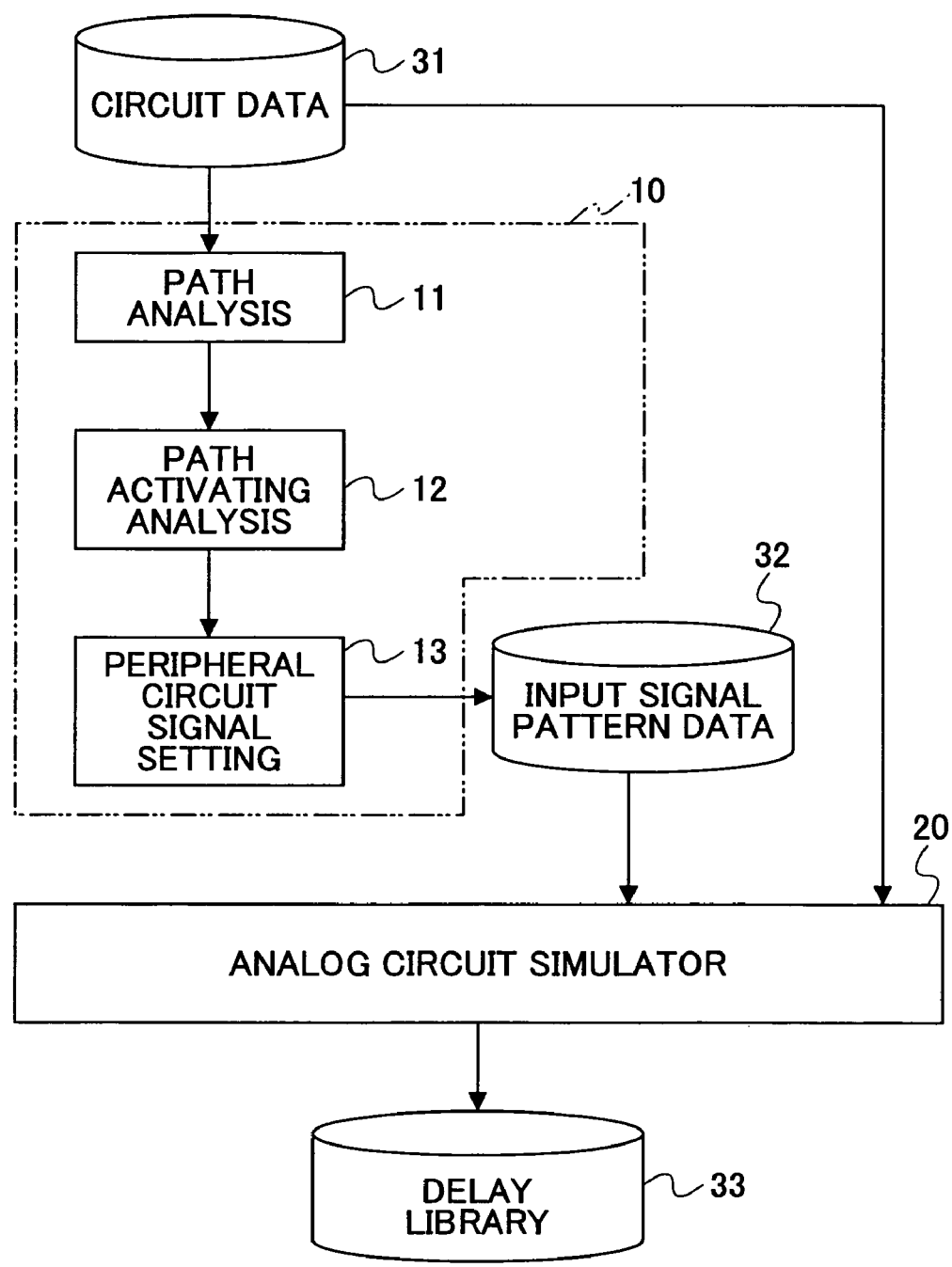
FIG. 1 is a block diagram showing a general configuration of a circuit analysis system in one embodiment of the present invention.

FIG. 1 shows a system block diagram of a circuit deign analysis system according to an embodiment of the present invention.

As shown, the circuit deign analysis system according to the present embodiment includes a simulation input pattern production part 10 and an analog circuit simulator 20. This system is achievable with the use of a general-purpose computer and a software program installed therein, as will be described later with reference to FIG. 11 for example.

In this system, first, LSI circuit deign data 31, designed by a predetermined design process, is given to a path analysis part 11 of the simulation input pattern data production part 10. The circuit data thus given does not include information of actual physical characteristics of respective circuit devices which are those included in a common LSI circuit, physical characteristics of wiring connection between these circuit devices and so forth, but includes data for selecting of circuit device types to be applied (an NMOS transistor, an PMOS transistor, or such), a logical configuration such as connection between the respective circuit devices, or such. The simulation input pattern data production part 10 receiving it then obtains a simulation input pattern, which is necessary and sufficient for starting up (activating) a circuit operation to be actually tested by the simulation for the relevant circuit configuration, from the input circuit data, in consideration of an actual operation purpose of the relevant LSI circuit, basic circuit characteristics or such, by means of a predetermined method.

Generally speaking, in one set of LSI circuit configuration data, the number of all possible simulation input patterns increases exponentially according to the circuit size. In particular, for a recent very large scaled LSI circuit or such, a considerable time and man-hours are required when circuit operation testing is carried out for all the possible input patterns by simulation. Therefore, it is necessary to previously determine a minimum number of truly necessary input patterns in consideration of an actual operation purpose of the relevant circuit, basic circuit characteristics or such. As a method of obtaining the minimum number of truly necessary input patterns, 'Activating Pattern Production Method' included in an activating path simulation method proposed by the present inventor and so forth in Japanese Laid-open Patent Application No. 2001-76020 mentioned above is applicable, for example.

Then, a path activating analysis part 12 carries out path activating analysis processing on the thus-obtained basic simulation input patterns in a logical view point. This analysis processing does not include circuit delay analysis or such to be carried out based on detailed physical characteristics of the respective circuit devices, wirings or interconnections and so forth, but only includes processing of testing as to whether or not the desired logical operation can be positively carried out in a condition in which the respective circuit devices are regarded as simple logical devices.

Next, a peripheral circuit signal setting part 13 obtains input patterns for a predetermined circuit part, which is a peripheral circuit part of the active path (the target circuit part to be tested for its operation with the use of the input pattern) with respect to the simulation input pattern data extracted and tested for the active path as mentioned above. That is, in addition to the simulation input pattern including input signals for a node which determines a basic logical operation of the active path to be tested, the simulation input pattern including input signals for a node which does not affect the logical operation of the active path but substantially affects a signal propagation operation delay relating to the logical operation of the active path, is obtained.

Specifically, a node which does not affect the logical operation of the active path but affects the signal propagation operation delay thereof is extracted, and further, as a signal setting value, a setting value affecting the signal propagation operation delay relating to the operation of the active path and a signal transition thereof are determined. This extracting operation is automatically carried out by an application program according to a basic input relating data, a signal setting rule or such previously set by an operator, another analysis system or such. Then, the thus-set input pattern data 32 (including the node input signal setting directly relating to the logical operation of the active path, and the node input signal setting not directly relating thereto but affecting the operation delay thereof) is input to the analog circuit simulator 20.

The analog circuit simulator 20 carries out detailed simulation for a circuit operation which should occur when the input signals according to the input pattern data are input to the circuit configuration (not only the basic logical configuration but also detailed physical data of the respective circuit devices, wiring and so forth) by means of logical operation of a computer, based on the simulation input pattern data 32 and the circuit deign data 31, and then, outputs a result thereof as a delay library 33. This delay library 33 includes the operation simulation result of the active path, and, in this case, corresponds to the analysis result including not only the testing result of simple logical operation testing but also the result of analysis for the signal propagation operation delay condition between the input and the output of the path active in consideration of the detailed physical data (impendence data or such) of the respective circuit devices, wirings and so forth.

Figure 2:
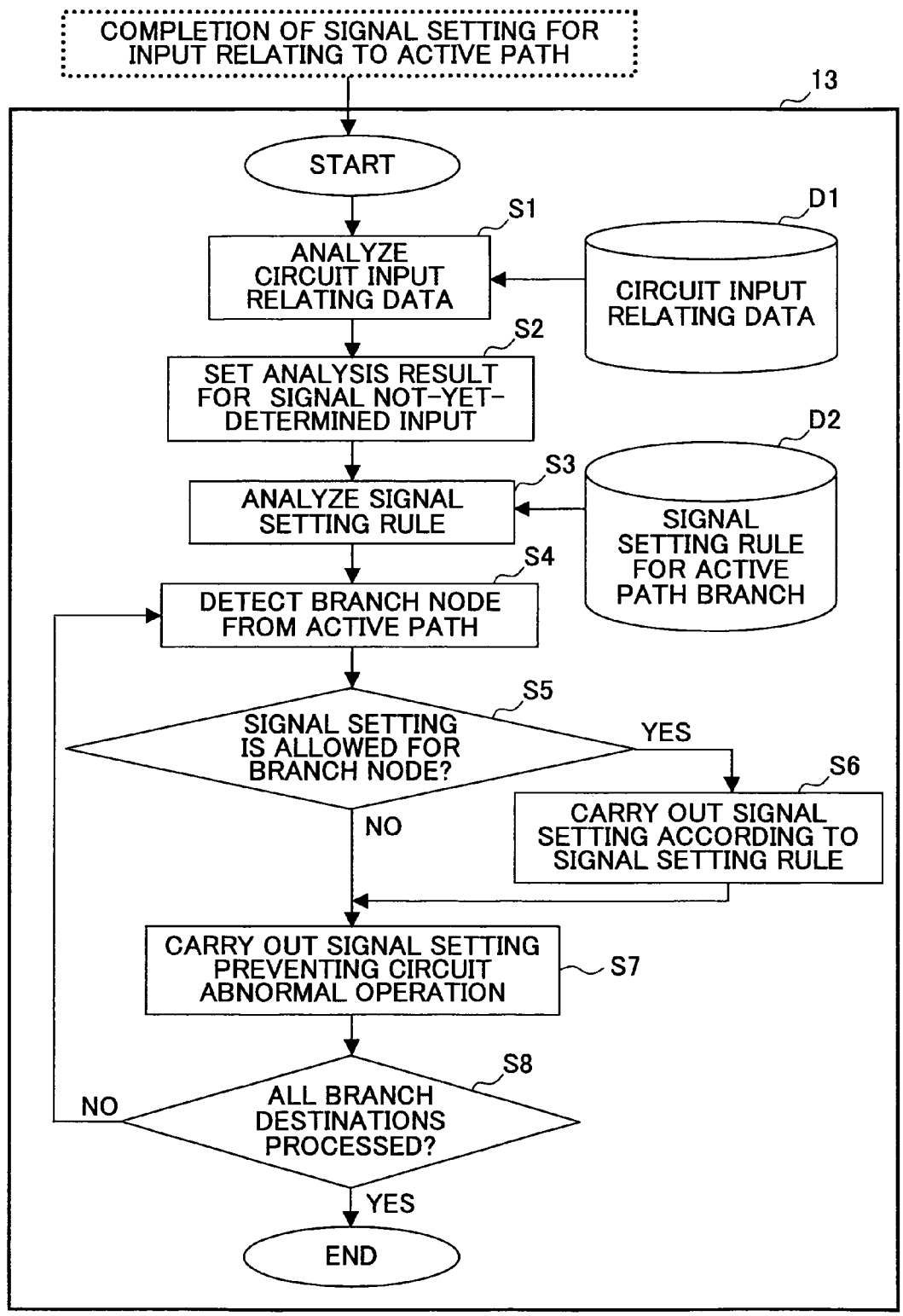
FIG. 2 is a flow chart for describing details of operation of a peripheral circuit signal setting part of the circuit analysis system shown in FIG. 1.
Figure 3:
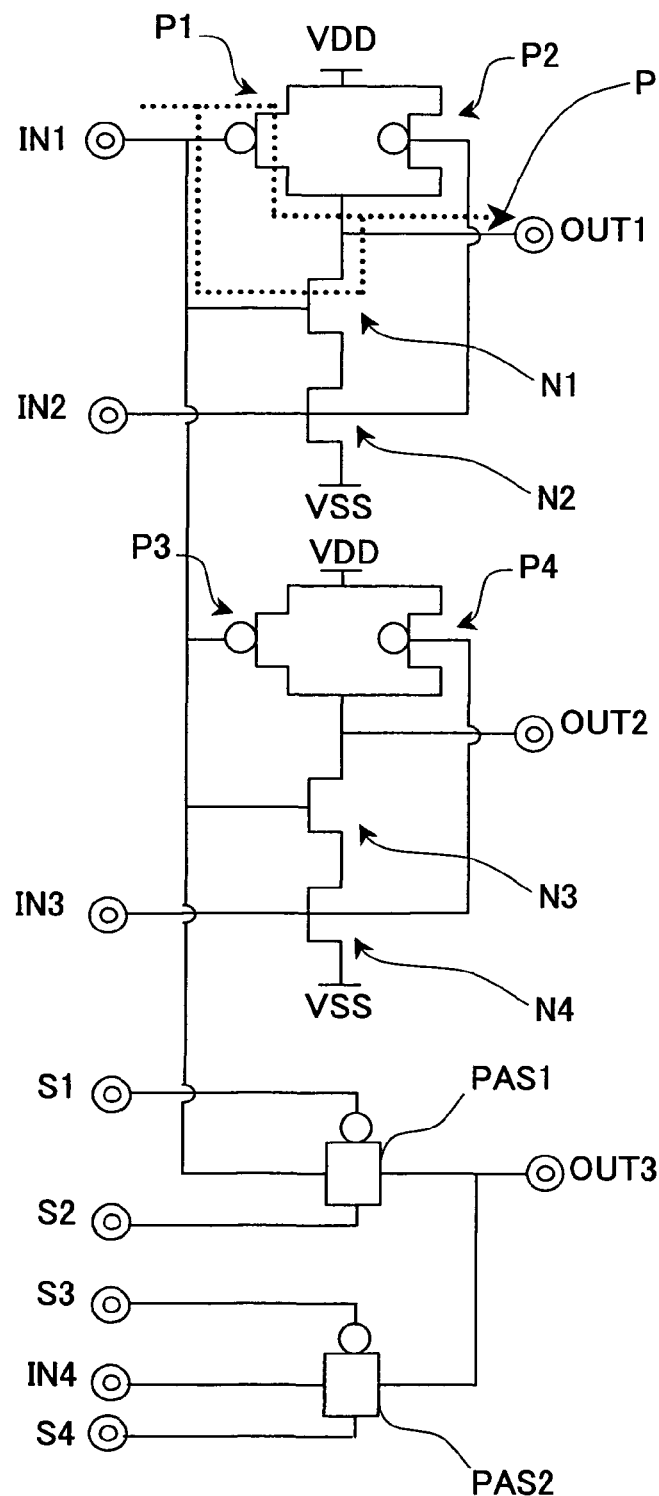
FIG. 3 is a circuit diagram showing an example of a transistor circuit to be analyzed, for illustrating actual operation of the embodiment of the present invention.

FIG. 2 shows a flow chart of operation executed by the peripheral circuit signal setting part 13 shown in FIG. 1. Here, description is made for the operation of this setting part 13 for a case where, as an example of the circuit configuration to be tested by this analysis system in the present embodiment, a circuit configuration shown in FIG. 3 is applied. In the circuit configuration shown in FIG. 3, a path indicated by an arrow P of a broken line are assumed as the active path to be tested. In this case, all nodes IN3, S1, S2, S3, IN4 and S4, other than nodes IN2 and IN2, are those which do not affect logical operation of the active path P.

Figures 4A, 4B, 4C:
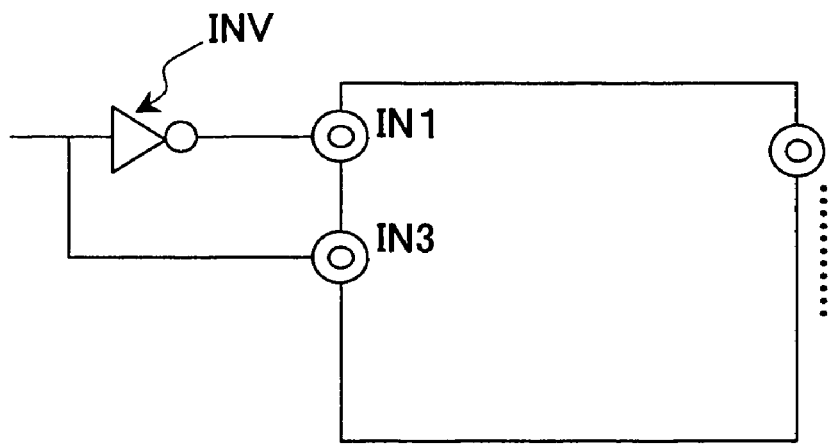
FIGS. 4A, 4B and 4C show circuit input relating data applicable to circuit analysis according to the embodiment of the present invention.

In FIG. 2, in Step S1, analysis is carried out for the circuit input relating data. That is, as shown in FIG. 4A, for the above-mentioned nodes IN1 and IN3, assuming that an inverter INV is connected to these input nodes, input signal patterns of these nodes should include signals inverted from one another as shown in FIGS. 4B and 4C accordingly. Thereby, if a signal "1" is set on the node IN1 of the active path, an inverted value thereof, i.e., a signal "0" should be set on the node IN3 (Step S2).

That is, in Steps S1 and S2, a setting is made for a node, other than the nodes (IN1 and IN2), directly relating to the active path (P), a setting is made when the setting is necessarily determined by requirements from an input part (the inverter INV shown in FIG. 4A, for example) of the relevant analysis target circuit configuration. Respective input signal settings for the nodes (IN1 and IN2) directly relating to the active paths (P) are already made by the path analysis part 11 shown in FIG. 1 as the setting for the nodes activating the active path or the nodes directly affecting the logical operation of the active path, and the basic logical operation thereof is already tested in the path activating analysis part 12 as mentioned above.

Figure 6:
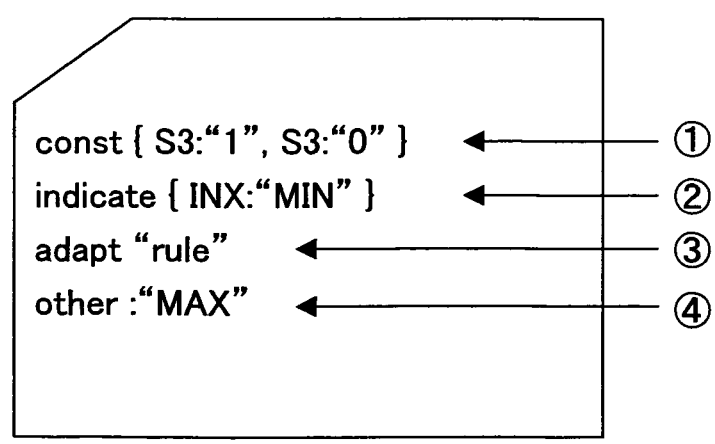
FIG. 6 illustrates an example of a description of a signal setting rule for an active path branch, which is applicable to circuit analysis according to the embodiment of the present invention.

Next, in Step S3, signal rule analysis is carried out. That is, requirements to be applied to values to be set as input signals for nodes not directly relating to the active path are previously provided, as shown in FIG. 6, and node input signal setting values determined according to these requirements (rules) are set.

Then, in Step S4, a branch node from the active paths is extracted. That is, a node which affects the logical operation of a circuit part which is branched off from the active path is detected. That is, in the example of FIG. 3, the respective nodes IN3, S1, S2, S3, IN4 and S4 are detected in sequence as the branch nodes.

Then, in Step S5, for each of the thus-detected branch nodes, it is determined whether or not the signal setting is already made according to the requirements obtained from the processing of the already carried out steps. That is, it is determined as to whether or not the signal setting is already made according to the requirements of the circuit input relating data obtained in Steps S1 and S2 or the requirements of the signal setting rules obtained in Step S3. Then, when it is determined the setting is already made (Yes in Step S5), the signal input is actually set according to the relevant requirements, in Step S6.

Figure 5:
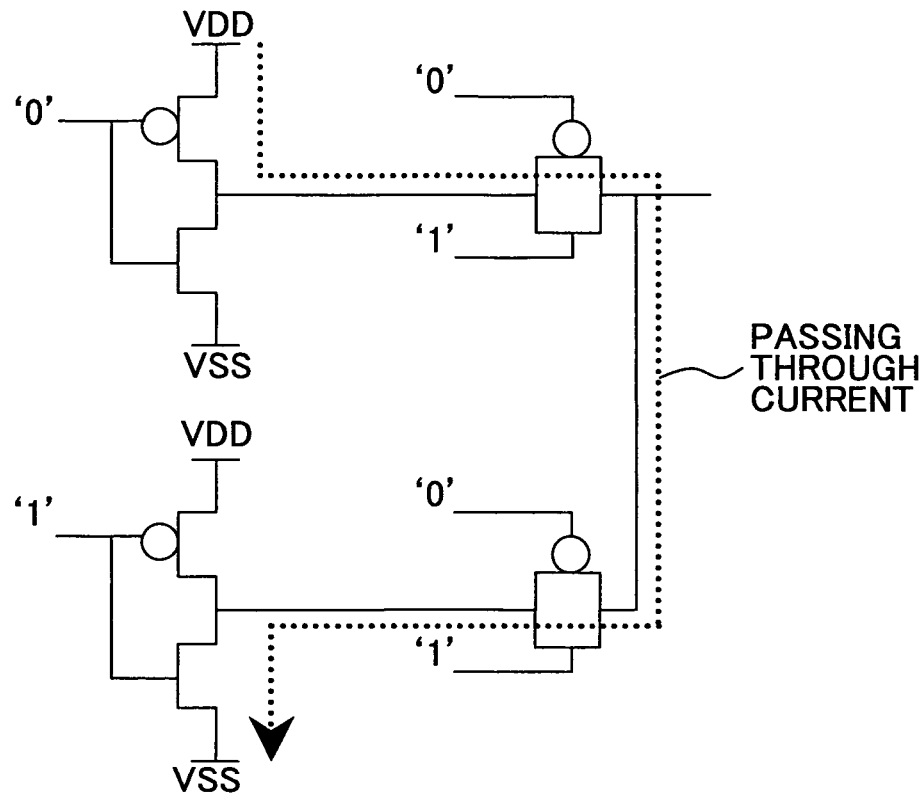
FIG. 5 illustrates a signal setting rule prepared for preventing circuit abnormal operation, which is applicable to circuit analysis according to the embodiment of the present invention.

When it is determined that the setting is not yet made as a result of the determination of Step S5, or after the actual setting is already made in Step S6, the input signal settings for the nodes are tested in a view point of preventing abnormal circuit operation. That is, a requirement is set such that input setting, which should not be obviously made, should not be made actually. For example, a requirement is made such that, an input setting which necessarily causes an abnormal operation of the circuit such as flowing of a 'passing through current', as shown in FIG. 5, for example, should not be made.

Then, in Step S8, it is determined whether or not all the branch nodes have been processed. When some have not been processed, the processing is returned to Step S4, and, the processing of Steps S4 through S7 is carried out on the remaining nodes.

Next, taking the circuit configuration of FIG. 3 as an example, the processing of the peripheral circuit signal setting part 13 in the embodiment of the present invention is described in detail.

As described above, a signal setting for an input node which does not affect logical operation of the active path is understood as being unnecessary at least with regard to the activation of the active path of a transistor circuit. However, in a case of a very high speed LSI circuit or such, a signal propagation operation delay in the active path may be much affected by an operation state of the peripheral circuit. Accordingly, for the purpose of obtaining a value of an accurate delay of the critical path, it is necessary to consider a state of the peripheral circuit. In the embodiment of the present invention, the following three methods are applied as methods to carry out signal settings for input pins which do not affect logical operation of the active path:

(1) Maximum delay calculating signal setting method (algorithm);

(2) Minimum delay calculating signal setting method (algorithm); and (3) Signal setting method (algorithm) in consideration of actual circuit operation.

These methods are described in detail below. In the circuit of FIG. 3, the active path P includes a well-known CMOS inverter configuration made of a PMOS transistor P1 and an NMOS transistor N1. Therefore, when a value applied to the input pin IN1 thereof is '0', the PMOS transistor P1 enters an OFF state, while the NMOS transistor N1 enters an ON state. As a result, a value appearing on the output pin OUT1 is '1'. Further, as to the input pin IN2, according to a logical study concerning the activation of the active path P, '1' should be always applied to this pin IN2 for the purpose of allowing the above-mentioned operation of the CMOS inverter.

In this case, any signal setting for the other pins IN3, IN4 and S1 through S4 does not logically affect the above-mentioned activation from IN1 through OUT1. However, in order to obtain an accurate delay value, signal settings for these inputs may also become significant. In the above-mentioned 'maximum delay calculating signal setting method' (that is, a signal setting maximizing a delay amount of operation of the above-mentioned active path), the following signal setting is carried out for a case where a value applied to the pin IN1 changes from '0' to '1'. That is, for this case, a signal setting intentionally obstructing electrical charging operation in the pin IN1 is made to avoid changing of its value into '1' (that is, into a positively charged state), that is, the signal setting should be made whereby a signal is easily propagated in a diffusion manner to the branch paths other than the active path, and thus, a longer time should be required for charging the active path. The signal settings meeting such a requirement include, in the case of the circuit shown in FIG. 3, IN3='1', S1='0' and S2='1'.

That is, as a result of the signal setting of IN3='1' being made, a 2 NAND circuit (including PMOS transistors P3 and P4 and NMOS transistors N3 and N4) having an output OUT2 works, and thereby '0', which is opposite in phase from that of IN1 is output to the pin OUT2. Thereby, an apparent capacitance between the pin OUT1 and the pin IN1 increases, and as a result, a load to be charged up from the pin IN1 becomes apparently larger. Further, the signal settings of S1='0' and S2='1' cause the pass transistor PAS1 to enter a conductive state, and as a result, a load to be charged up from the pin IN1 also becomes apparently larger. The pin IN1 should be eclectically charged to change its value from '0' to '1'. However, since the path from IN1 through OUT3 has thus entered the conductive state, a part of the electrical charge otherwise to be supplied to the pin IN1 escapes through the pin OUT3, and thus, charging up of the pin IN1 delays accordingly. As a result, activation of the active path P delays, operation of the transistors included in this path delays, and thus, the delay increases (so as to maximize the delay intentionally, which is the purpose of the maximum delay calculating signal setting method).

On the other hand, when the pin IN1 changes from '1' to '0', a signal setting is made to intentionally obstruct discharge of an electrical charge from the pin IN1 so as to avoid the value thereof from changing from '1' into '0'. That is, a signal setting is made such that signal diffusing propagation to the paths other than the active path, that is, the signal diffusion propagation through its branch paths may be effectively decelerated. Specifically, in this case, the value of the pin IN1 can be allowed to change from '1' to '0' as a result of the electrical charge of the pin IN1 being removed. However, by thus blocking the paths through which the electrical charge can otherwise diffuse or be removed from the pin IN1, the delay increases (so as to maximize the delay). In the example of FIG. 3, signal settings IN3='1', S1='1' and S2='0' are made for this purpose.

In fact, by means of the above-mentioned settings of S1='1' and S2='0', the pass transistor PAS1 enters a non-conductive state. As a result, the path from IN1 through OUT3 becomes non-conductive. As mentioned above, the electrical charge should be removed from the pin IN1 for changing of the value of the pin IN1 from '1' to '0'. However, since the path from IN1 through OUT3 thus becomes non-conductive, the electrical charge cannot be easily removed through the pin OUT3 from the pin IN1 via this path. As a result, a delay in the path activation increases in comparison to a case where the path from pin IN1 through the pin OUT3 is conductive.

Figure 7:
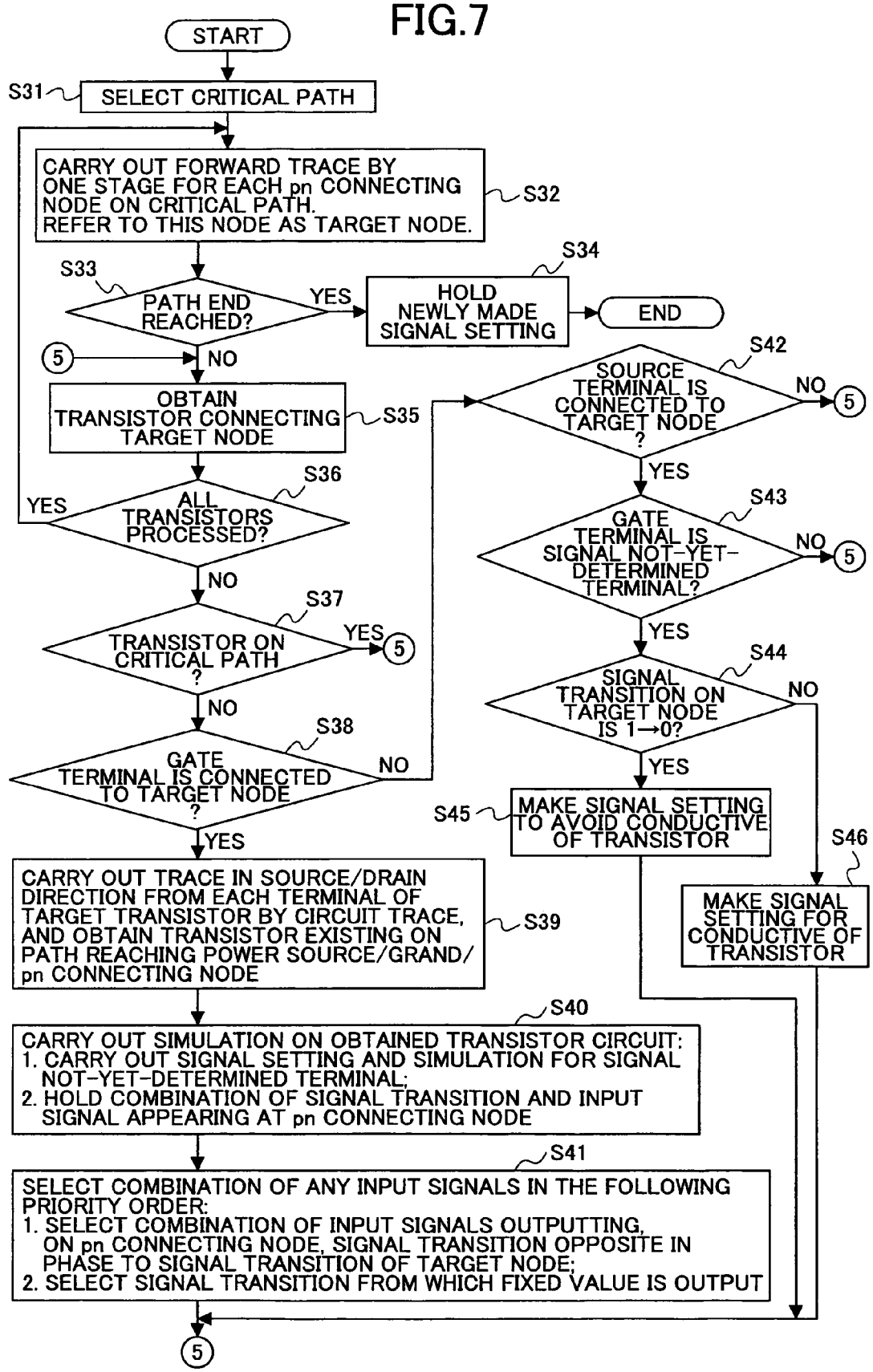
FIG. 7 is a flow chart for illustrating a maximum delay calculating signal setting algorithm, which is one example of the signal setting rule for an active path branch, which is applicable to circuit analysis according to the embodiment of the present invention.

FIG. 7 is a flow chart showing the operation of this maximum delay calculating signal setting method. First, in Step S31, an active path is selected, and, in Step S32, this path is traced so as to obtain a pn-connecting (connecting with both a PMOS transistor and an NMOS transistor) node. In Step S33, it is determined whether or not this node (target node) corresponds to a path terminal. When this does not correspond to a path terminal, a transistor connected with by this target node is obtained (in Step S35), and then, it is determined in Step S36 whether or not all the transistors connected with by this target node have been processed. When they have been already processed (Yes in Step S36), the processing is returned to Step S32, then a subsequent node is obtained there, and the processing of Steps S32 through S36 is repeated thereon. When all the transistors connected with by the target node have not been processed yet (No in Step S36), Step S37 is carried out in which it is determined whether or not this target transistor corresponds to a transistor on the active path. When this transistor is a transistor on the active path (Yes), the processing is returned to Step S35, and then, a target transistor to process is changed to a subsequent not-yet-processed one in Step S35.

When the target transistor is a transistor on the active path (Yes in Step S37), it is determined in Step S38 whether or not the target transistor is connected with the target node with its gate terminal. When the determination result is No (that is, when this transistor is the pass transistor PAS1, for example, in the circuit of FIG. 3), it is determined in Step S42 whether or not the target transistor is connected with the target node with its source terminal. When the target transistor is not connected to the target node with its source terminal (No), the processing is returned to Step S35, and a target transistor to process is changed to a subsequent not-yet-processed transistor. When the target transistor is connected to the target node with its source terminal (Yes in Step S38) (for example, the case of the pass transistor PAS1 in the circuit of FIG. 3), it is determined in Step S43 whether or not its gate terminal has not yet a signal setting made thereto. That is, it is determined whether or not another requirement has been already applied to the relevant terminal as shown in FIG. 4A for example. When no signal setting has been made (Yes in Step S43), it is determined in Step S44 whether or not a signal transition of the target node is 1→0. That is, it is determined whether or not the activation operation of the active path corresponds to the operation of removing the electrical charge from the target node.

When the determination result is Yes in Step S44, a signal setting is made such as to obstruct operation of causing the target transistor to be conductive. That is, for the case of removing the electrical charge, a path through which the electrical change of the node can be removed is blocked as a result of obstructing the operation of causing the target transistor to be conductive. As a result, the delay is made to increase intentionally. On the other hand, in the contrary case (No in Step S44; i.e., for 0→1), the target transistor is made to become conductive, thus a path through which the electrical charge can be removed from the target node is positively provided, and as a result, the target node is made not to be easily charged to result in the above-mentioned change from 0 to 1. As a result, the delay is made to increase intentionally.

Further, when the determination result in Step S38 is Yes, that is, when a logic of the target transistor is directly determined by a signal of the target node (in the example of FIG. 3, the transistor P3 corresponds thereto), tracing is carried out between terminals of the target transistor in a direction from the source through the drain in Step S39. Thus, transistors existing on a path from the power source, through the ground and through the relevant pn connecting node (in this case, OUT2 in FIG. 3, for example) is extracted. Then in Step S40, simulation for signal input/output is made for a signal-not-yet-set terminal of each of the thus-extracted transistors. The result thereof is then stored. Then in Step S41, based on the thus-stored result, a signal input which causes a signal transition of the pn-connecting node (OUT2, for example, as mentioned above), opposite in phase to that of the target node (in the case of FIG. 3, IN1), is intentionally selected for each of the above-mentioned signal-not-yet-set terminal if such a signal input is available. As a result, a capacitance value existing between the target transistor and the target node can be made to become apparently larger as mentioned above. As a result, a load capacitance to charge up to achieve the relevant signal transition on the target node becomes larger accordingly, and thus, the delay increases accordingly. On the other hand, when such a signal input does not exist for the relevant signal-net-yet-set terminal, a signal input resulting in a predetermined fixed value (any value) is selected.

Next, in the above-mentioned 'minimum delay calculating signal setting method (that is, signal setting intentionally minimizing a signal delay amount in operation of the relevant active path), a signal setting is made which does not obstruct charging of an electrical charge in the pin IN1 which results in a value '1' of the pin IN1 for a signal transition of '0'→'1' on the pin IN1. That is, a signal setting is made to intentionally avoid a signal diffusing propagation through the branch paths other than the active path. In the example of FIG. 3, signal settings are made, i.e., IN3='0', S1='1' and S2='0'. By the setting IN3='0', the 2 NAND circuit (including the transistors P3, P4, N3 and N4) works to always output '1' on the pin OUT2, which is the same as '1' which the pin IN1 should finally have in the above-mentioned relevant signal transition '0'→'1'. Accordingly, in comparison to a case where a signal '0' opposite in phase to the '1' to which the pin IN1 should finally have, a required capacitance to charge up effectively decreases, thus a load to charge becomes smaller apparently, and as a result, the charge operation speed is increased, whereby the delay is reduced accordingly.

Further, by the above-mentioned settings of S1='1' and S2='0', the above-mentioned pass transistor PAS1 becomes non-conductive, and, as a result, the path from IN1 through OUT3 becomes non-conductive. When the pin IN1 changes from '0' to '1', an electrical charge should be charged in the pin IN1. As a result of the path from IN1 through OUT3 thus becoming non-conductive or blocked, no path through which an electrical charge is removed from the pin IN1 is provided, and thus, a delay occurring when the active path is activated is reduced accordingly.

On the other hand, when the pin IN1 should change from '1' to '0', signal settings by which removal of the electrical charge from the pin IN1 is not obstructed, that is, the change into '0' of this pin IN1 is not obstructed is made. In other words, signal settings by which a signal or an electrical charge can be easily propagated in a diffusion manner from the pin IN1 to the branch paths other than the active path is made. In the example of FIG. 3, the respective settings of IN3='0', S1='0' and S2='1' are made. By the settings of S1='0' and S2='1', the path from the pin IN1 through the pin OUT3 becomes conductive as mentioned above. When the pin IN1 changes from '1' to '0', the electrical charge should be removed from the pin IN1. When the path from IN1 through OUT3 is thus conductive as mentioned above, a part of the electrical charge is easily removed from the pin IN1 through the pin OUT3. As a result, the delay decreases in comparison to the case where the path from IN1 through OUT3 is non-conductive.

Figure 8:
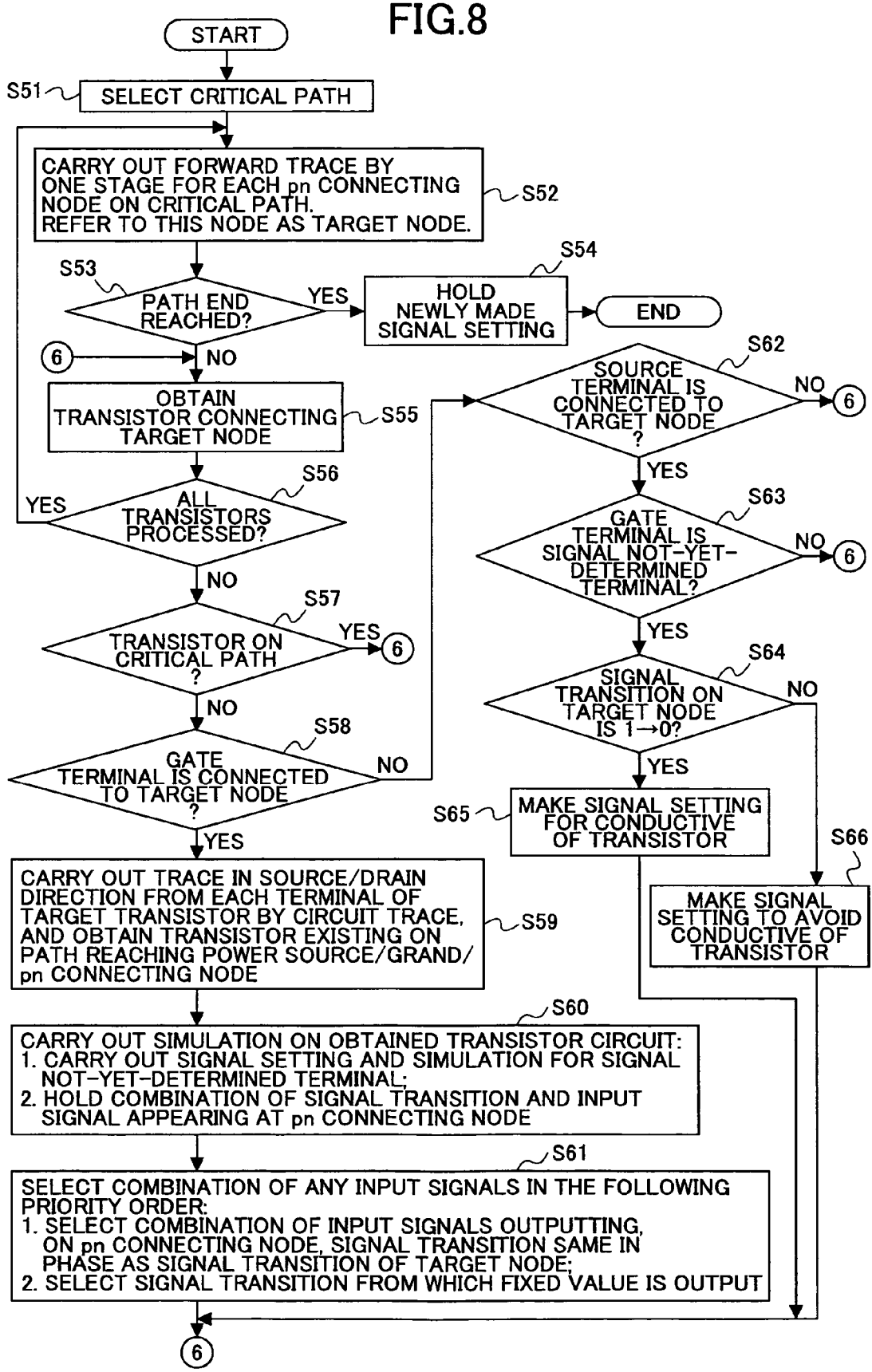
FIG. 8 is a flow chart for illustrating a minimum delay calculating signal setting algorithm, which is one example of the signal setting rule for an active path branch, which is applicable to circuit analysis according to the embodiment of the present invention.

FIG. 8 is a flow chart showing this operation of the minimum delay calculating signal setting algorithm. The flow of operation is basically the same as the above-described algorithm of FIG. 7. That is, Steps S51 through S66 of FIG. 8 correspond to Steps S31 through S46 of FIG. 7, respectively. However, in Step S65, a signal setting is made to cause the transistor to enter a conductive state, while, in Step S66, a signal setting is made to cause the transistor not to enter the conductive state. Thus, a relationship between the operation to cause the transistor to enter the conductive state and the operation to cause the transistor not to enter the conductive state is opposite to one another in Steps S65 and S66 in comparison to Steps S45 and S46 of FIG. 7. Further, in Step S61, a signal input which results in a signal transition on the pn-connecting node the same in phase as that on the target node is made, which is opposite to Step S41 in which a signal input which results in signal transition on the pn-connecting node opposite in phase to that on the target node is made. That is, as is opposite to the case of the above-described maximum delay calculating signal setting algorithm, when the target node is charged (0→1), a path allowing removal of the electrical charge from this node is not provided. In contrast thereto, when the target node is discharged (1→0), a path for allowing removal of the electrical charge from this node is positively provided. Further, a time required to charge up is shortened as a result of a charging load capacitance to be charged up from the target node being apparently reduced. Thus, the delay is reduced effectively.

Further, in a case where an available signal relationship between the pin IN1 and the pin IN3 is already determined externally as shown in FIG. 4A for example, a determination for the above-mentioned maximum or minimum delay calculating signal setting for the pin IN3 is not required accordingly after the signal determination for the active path (signal setting for IN1) is made, in the circuit shown in FIG. 3.

Next, in the above-mentioned 'signal setting method (algorithm) in consideration of actual circuit operation', signal settings in consideration of an actual circuit operation are made. That is, in the case of FIGS. 4A through 4C for example, an application software is provided by which the above-mentioned inverse relationship between the pins IN1 and IN3 can be recognized in a form of a description of a logical operation, i.e., "IN1=!IN3" (FIG. 4B), a description of a table indicating an available signal relationship, i.e., "(IN1, IN3):(1, 0), (0, 1)" (FIG. 4C), or such. As a result, such information is applicable in the automated analysis. Therewith, as to an input to any node, processing is carried out by which, when an input for another related node is determined, a signal value for the relevant node is uniquely determined, or is limited to a predetermined range automatically by means of automated operation by the function of the application software.

Figure 9:
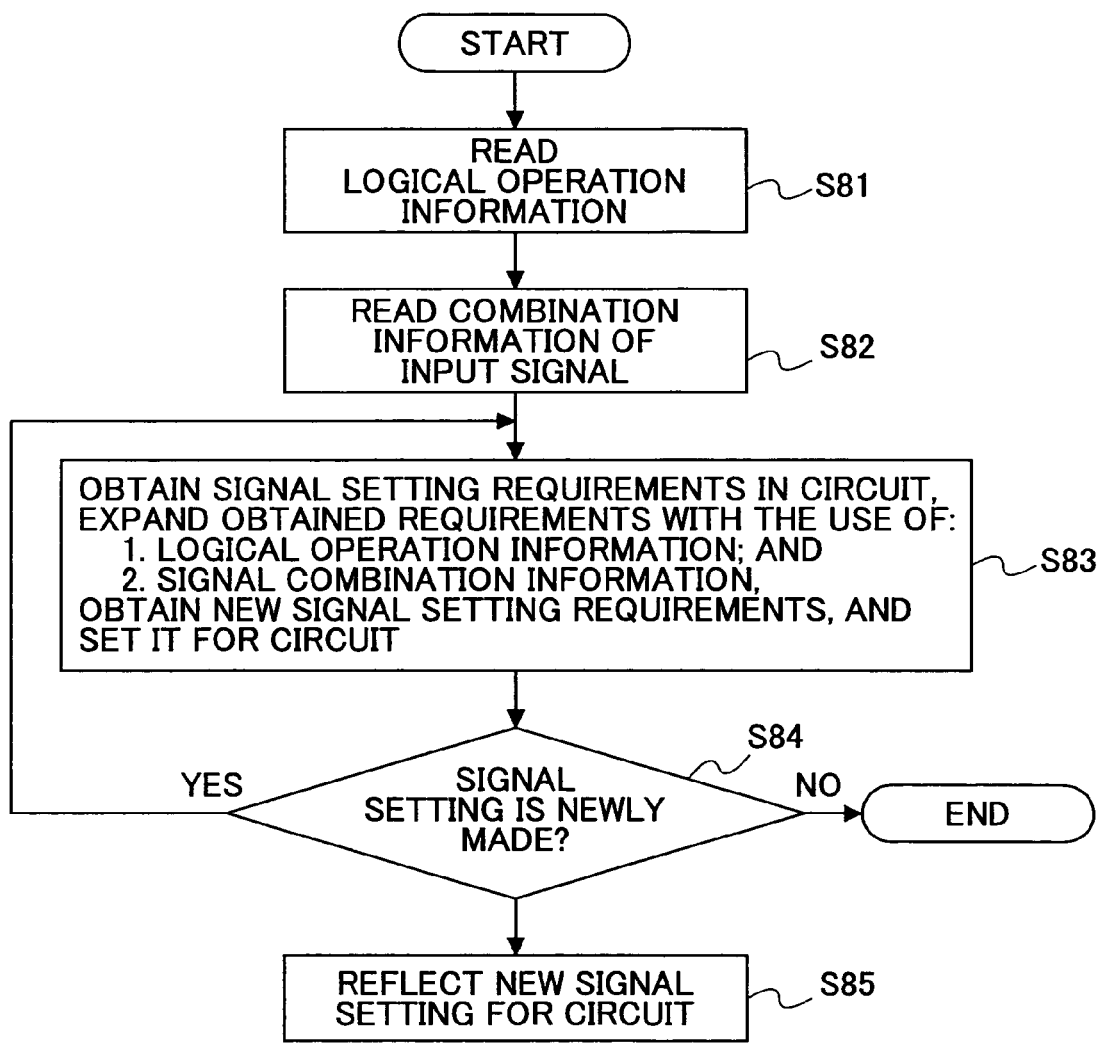
FIG. 9 is a flow chart for illustrating a signal setting algorithm considering actual circuit operation, which is one example of the signal setting rule for an active path branch, which is applicable to circuit analysis according to the embodiment of the present invention.

FIG. 9 is a flow chart showing the above-mentioned signal setting algorithm in consideration of actual circuit operation. In Step S81, previously prepared logical operation information such as that shown in FIG. 4B is read in. In Step S82, information concerning available combinations of the input signals such as those shown in FIG. 4C is read in. Then in Step S83, based on predetermined various signal setting requirements separately given to the simulation target circuit, the signal setting is expanded in consideration of the requirements read in, in Steps S81 and S82. That is, various input/output requirements in accordance with an actual operation purpose of the relevant LSI circuit are set for the relevant operation testing target circuit configuration (design data). Then, possible circuit logical operations thereof satisfying these requirements are obtained from automated logical operation, and, based on the thus-obtained new signal settings, further possible logical operations are carried out. This process is repeated in a loop of Steps S83 and S84. By carrying out the operation, the signal settings in accordance with the actual operation purpose of the relevant LSI circuit are finally obtained. Therewith, a simulation in accordance with the actual circuit is achievable in consideration of the intended purpose of the LSI circuit. Thus, it is possible to obtain the desired delay information with a high accuracy.

Figure 10A:
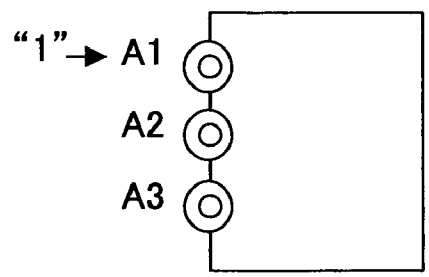
FIGS. 10A and 10B illustrate the signal setting algorithm considering actual circuit operation shown in FIG. 9.
Figure 10B:
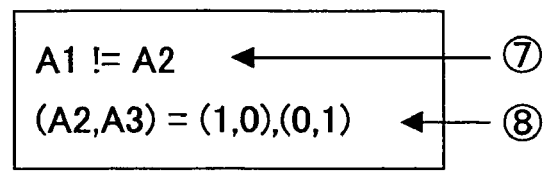

For example, in an example of a circuit shown in FIG. 10A, a case is assumed in which a signal of "1" is set for a pin A1, and signals are not yet set for pins A2 and A3. From a first line ⑦ of circuit input relating data shown in FIG. 10B, it is seen that, when the pin A1 has a value "1", the pin A2 has a value, i.e., "0", inverted from that of the pin A1. It is noted that the symbol "!" shown in FIG. 10B, line 1 denotes such an inverted relationship. The circuit input relating data shown in FIG. 10B is one read in, in Step S81 in the flow chart of FIG. 9, and corresponds to the data D1 shown in FIG. 2. Further, from the second line ⑧ of the same circuit input relating data of FIG. 10B, it is seen that the value which the pin A3 can have is only "1" when the pin A2 has the value "0". Since the signal "1" is set on the pin A1 as mentioned above, the pin A2 has the value "0" according to the above-mentioned inverted relationship between the pins A1 and A2. As a result, the pin A3 has the value "1" accordingly. Thus, by designating the external requirements based on the operation requirements, the signal settings precisely in accordance with the actual operation requirements of the relevant LSI circuit can be achieved.

However, in such a signal setting manner considering actual circuit operation (the signal setting in consideration of actual circuit operation), it is necessary to convert a transistor circuit into a logical algebra, as shown in FIG. 10B, for example. Upon designing a huge custom cell, it is difficult to covert all the necessary configuration of the circuit into a logical algebra. For such a case, it may be advantageous to apply the above-mentioned maximum/minimum delay calculating signal setting method appropriately in a combined or a mixed manner. As a result, it is possible to carry out delay calculation responsive to the actual operation purpose, with a relatively simple configuration. It is preferable that, a manner of how to apply, each alone, or in the mixed manner, the above-mentioned maximum/minimum delay calculating methods and delay calculating method in consideration of actual circuit operation is previously given eternally in a form of a rule, then, the rule to be actually applied is changed appropriately according to the particular circuit configuration or the intended purpose, and thereby, it is possible to adapt the embodiment of the present invention to various cases.

FIG. 6 shows an algorithm as a "signal setting rule for active path branch" (corresponding to the data D2 in FIG. 2). In the description shown in FIG. 6, the line located higher is given the higher priority for determining an order in which these requirements are applied. The description ① denotes a fixed value designation requirement, and indicates that "1" should be set for the node S1, while "0" should be set for the node S3. The description ② denotes a signal setting node designation requirement, and indicates that, for the node INX, the above-mentioned minimum delay calculating signal setting method should be applied. The description ③ denotes a requirement indicating whether or not a predetermined rule should be applied, and specifically indicates that a signal setting should be carried out according to a predetermined circuit input relating data. If this description ③ does not exist, the application makes a signal setting without regard to the 'circuit input relating data'. The description ④ denotes an item for designating an algorithm to be applied to a general node, and the specific description "MAX" indicates that the maximum delay calculating signal setting algorithm should be applied unless any special designation is made.

Further, as to a signal input target node for which a signal setting has not been made yet by another requirement, a signal setting according to passing through current countermeasure requirements shown in FIG. 5 are applied for example (Step 2 of FIG. 2). That is, in an actual CMOS circuit, a signal setting resulting in a dielectric breakdown of the circuit should not be made. As a specific cause of such an abnormal operation, a case may be considered in which, for a circuit including a pass transistor as shown in FIG. 5, a short-circuit accident may occur from the power source node (VDD) through the ground (VSS), and a passing through current may flow accordingly. In order to avoid such a situation, it is preferable to previously make a signal setting by which, as much as possible, any transistor having no relation with the active path becomes non-conductive, for the purpose of positively avoiding such an abnormal and dangerous operation. Further, when a signal setting which may create a conductive path from the power source node through the ground is detected upon a circuit designing work, such a signal setting should be removed automatically.

That is, in the circuit analysis system according to the embodiment of the present invention, upon carrying out analysis for a signal delay occurring in predetermined operation of a predetermined circuit part, a peripheral circuit signal setting part is provided configured to carry out a signal setting according to a predetermined requirement for an input which does not logically affect the predetermined operation of the predetermined circuit part, and, in consideration of an influence of signal input according to this signal setting, a signal propagation operation delay in the predetermined operation of the predetermined circuit is analyzed. The predetermined requirement applied when the signal setting is made by the peripheral circuit signal setting part for the input which does not logically affect the predetermined operation of the predetermined circuit part is preferably made of a predetermined combination of a first requirement that such a limitation is applied that a signal setting may be made within a range excluding a signal setting which should not actually occur according to the requirements relating to the relevant circuit part; a second requirement that a signal setting is selected whereby a delay occurring in the predetermined operation of the predetermined circuit is maximized; a third requirement that a signal setting is selected whereby the delay occurring in the predetermined operation of the predetermined circuit is minimized; and a fourth requirement that a signal setting is selected which satisfies actual operation requirements.

According to the embodiment of the present invention described above, upon creating a test pattern to be applied for a delay analysis in simulation, a consideration is made not only in a path activation view point, but also in a view point of applying an actual load requirement of the circuit. Thereby, it is possible to achieve a more highly accurate delay calculation. Thereby, it is possible to obtain a delay value with a high accuracy according to the requirements close to those of the actual circuit even when a clock frequency increases in a very high speed LSI circuit or such. Specifically, a signal setting which does not possibly occur actually is not included in a simulation pattern applied to the delay calculation, and thus, it is possible to obtain the simulation pattern for the delay calculation more precisely. Further, by switching a method (applying a requirement selected from among the above-mentioned first through fourth requirements, for example) to generate the pattern according to the predetermined characteristics of the circuit to be tested, it is possible to obtain the pattern to be used for the delay calculation precisely in accordance with the actual circuit requirements.

Figure 11:
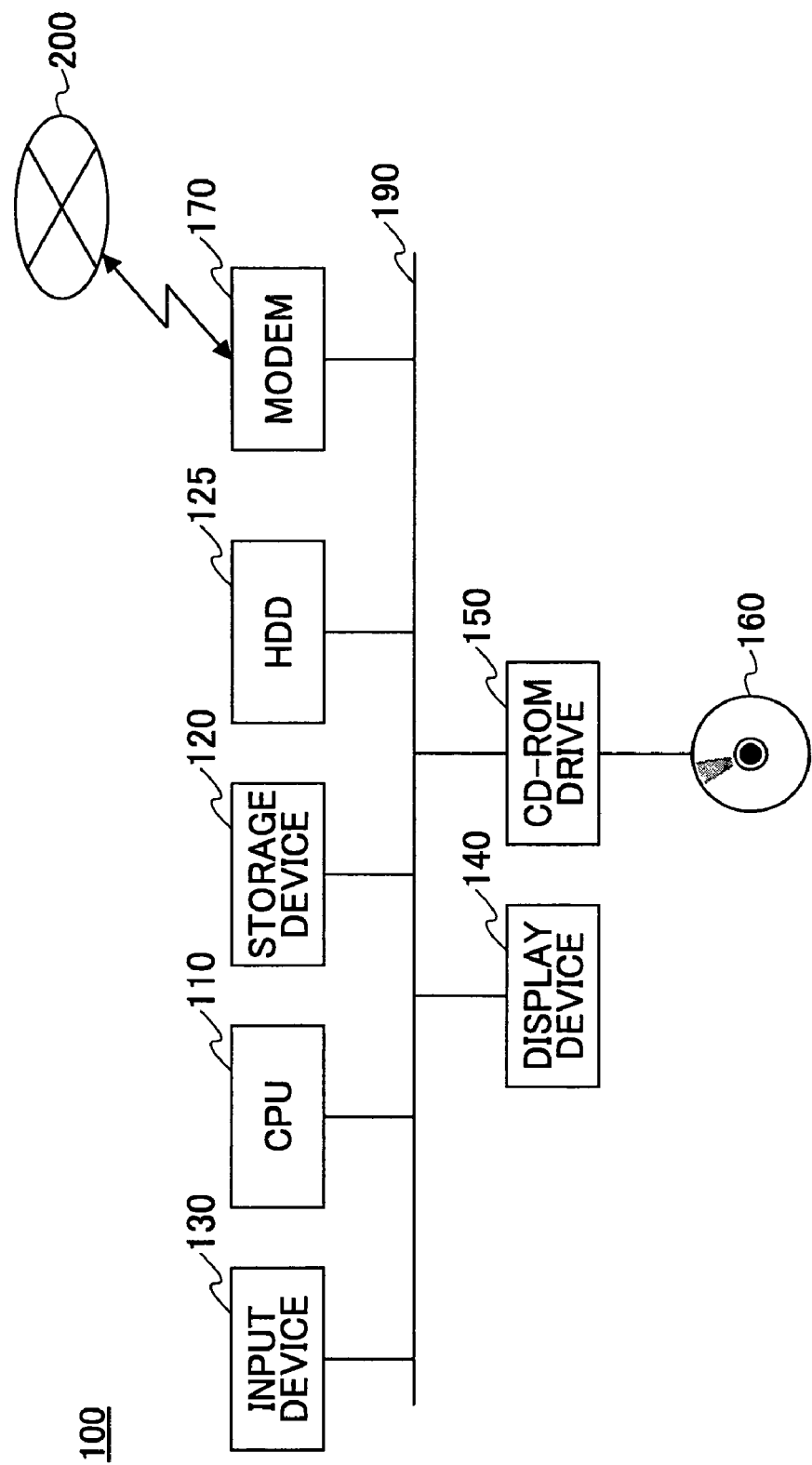
FIG. 11 is a block diagram showing a configuration of one example of a computer which can execute circuit analysis operation according to the embodiment of the present invention.

FIG. 11 is a block diagram showing an example of a computer by which the above-described circuit analysis operation according to the embodiment of the present invention is executable. As shown, the computer includes a CPU 110 carrying out the circuit analysis operation; a storage device 120 having a function as a temporary storage required for the operation of the CPU 110 such as a ROM, RAM or such; an input device 130 made of a keyboard, a mouse or such by which an operator inputs predetermined operation instructions, data or such to the computer; a display device 140 displaying processing results of the CPU 110 or such; a hard-disk drive (referred to as a HDD, hereinafter) 125 as a secondary storage; a CD-ROM drive (or a similar carriable recording medium drive such as a DVD-ROM drive or such) 150; and a modem 170 carrying out predetermined information processing by which communication of information with a remote counterpart via a communication network such as the Internet, LAN or such is available. These parts are mutually connected by a bus 190, and thereby, necessary information communication can be carried out thereamong.

When the circuit analysis operation according to the embodiment of the present invention is carried out by the computer, first a software program is prepared for causing the computer to function as the above-mentioned simulation pattern data production part 10 and the analog circuit simulator 20. Description of a specific method for preparing the program is omitted since the program may be created with an ordinary design skill of a program designer in the relevant technical field according to the above-described contents of the embodiment of the present invention.

The thus-prepared software program is stored in a carriable information recording medium such as a CD-ROM 160 previously, the CPU 110 reads it via the CD-ROM drive 150 in this case, and stores it in the HDD 150 once. Similarly, the predetermined circuit data 31 shown in FIG. 1 is read in via the CD-ROM drive 150, and is also stored in the HDD 125 once. The CPU 110 reads the above-mentioned software program from the HDD 125, and, based on the circuit data 31 read out from the HDD 125, the CPU 110 executes the circuit analysis operation according to the embodiment of the present invention in sequence according to instructions described in the software program.

During this time, as described above with reference to FIG. 1, the input signal pattern data 32 produced by the program acting as the simulation input pattern data production part 10 is processed by the program acting as the analog circuit simulator 20 together with the circuit data 31. As a result, a delay library 33 is produced. This delay library 33 is then stored in the HDD 125, CD-ROM 160 or such, or transmitted to a remote client via the communication network such as the Internet, LAN or such.

A method of introducing the program to be carried out by the computer, the circuit data 31 and so forth into the computer, is not limited to the above-mentioned method of applying the CD-ROM drive 150. For example, without applying such carriable information recording medium, but the program may be input to the computer from a predetermined server at a remote location via the communication network 200 such as the Internet, LAN or such.

Further, the present invention is not limited to the above-described embodiment, and variations and modifications may be made without departing from the basic concept of the present invention claimed below.

The present application is based on Intentional Priority Application No. PCT/JP2003/02654, filed on Mar. 6, 2003, the entire contents of which are hereby incorporated herein by reference.

What is claimed is:

1. A method for analyzing a signal propagation delay of a circuit part including a plurality of input nodes and a plurality of output nodes, the method comprising:

inputting a first input signal pattern to an input port of a circuit part to be analyzed;

inputting a second input signal pattern to a node of a peripheral circuit that is peripheral to the circuit part to be analyzed, the node of the peripheral circuit being a node that does not logically affect an operation of the circuit part to be analyzed but is configured to affect a signal propagation delay of the circuit part to be analyzed;

analyzing, by a computer, a signal propagation delay of the circuit part to be analyzed corresponding to the first input signal pattern inputted to the circuit part to be analyzed and the second input signal pattern inputted to the peripheral circuit;

extracting a node of the peripheral circuit, the node to be extracted being a node that does not logically affect the operation of the circuit part to be analyzed but is configured to affect a signal propagation delay of the circuit part; and inputting the second input signal pattern to the extracted node of the peripheral circuit.

2. The method according to claim 1, wherein a logical value of the second input signal pattern is determined so as not to logically affect the operation of the circuit part, but is configured to affect a signal propagation delay of the circuit part.

3. A method for analyzing a signal propagation delay of a circuit part including a plurality of input nodes and a plurality of output nodes, the method comprising:

inputting a first input signal pattern to an input port of a circuit part to be analyzed;

inputting a second input signal pattern to a node of a peripheral circuit that is peripheral to the circuit part to be analyzed, the node of the peripheral circuit being a node that does not logically affect an operation of the circuit part to be analyzed but is configured to affect a signal propagation delay of the circuit part to be analyzed;

analyzing, by a computer, a signal propagation delay of the circuit part to be analyzed corresponding to the first input signal pattern inputted to the circuit part to be analyzed and the second input signal pattern inputted to the peripheral circuit;

selecting, among a plurality of second input signal patterns, a signal pattern that provides a maximum signal propagation delay, or a minimum signal propagation delay, of the circuit part as a third input signal pattern; and setting a signal to be inputted to the peripheral circuit based on the third input signal pattern.

4. The method according to claim 3, wherein a logical value of the second input signal pattern is determined so as not to logically affect the operation of the circuit part, but is configured to affect a signal propagation delay of the circuit part.

5. A circuit analyzing device for analyzing a signal propagation delay of a circuit portion having a plurality of signal input lines and signal output lines, the circuit analyzing device comprising:

a first input pattern generating unit that generates a first input signal pattern that is an initial input signal pattern to be inputted to the circuit portion to be analyzed;

a peripheral circuit signal setting unit that extracts a node of a peripheral circuit that is a node that does not logically affect the operation of the circuit portion to be analyzed but affects a signal propagation delay of the circuit portion to be analyzed, and generating a second input signal pattern to be inputted to the node of a peripheral circuit in accordance with the first input signal pattern; and a simulator that analyzes a signal propagation delay of the circuit portion to be analyzed based on the inputted first input signal pattern and the inputted second input signal pattern.

6. The circuit analyzing device as claimed in claim 5, wherein the peripheral signal setting unit extracts a third input signal pattern, the third input signal pattern being a signal pattern in which a delay time of the circuit portion to be analyzed becomes a maximum or a minimum.

7. The circuit analyzing device as claimed in claim 5, wherein the peripheral signal setting unit extracts the node of the peripheral circuit by detecting a node that is branched off from the circuit portion to be analyzed.

* * * * *

UNITED STATES PATENT AND TRADEMARK OFFICE
CERTIFICATE OF CORRECTION

| | | |
|---|---|---|
| PATENT NO. | : 7,739,638 B2 | Page 1 of 1 |
| APPLICATION NO. | : 11/072605 | |
| DATED | : June 15, 2010 | |
| INVENTOR(S) | : Masashi Arayama | |

It is certified that error appears in the above-identified patent and that said Letters Patent is hereby corrected as shown below:

On the Title Page, under Item (*) Notice, please delete:
        "This patent is subject to a terminal disclaimer."

Signed and Sealed this
Eighteenth Day of October, 2011

David J. Kappos
*Director of the United States Patent and Trademark Office*